(12) United States Patent
Huang et al.

(10) Patent No.: US 9,735,297 B2
(45) Date of Patent: Aug. 15, 2017

(54) METHOD FOR PREPARING LIGHT ABSORPTION LAYER OF COPPER-INDIUM-GALLIUM-SULFUR-SELENIUM THIN FILM SOLAR CELLS

(75) Inventors: Fuqiang Huang, Shanghai (CN); Yaoming Wang, Shanghai (CN)

(73) Assignee: SHANGHAI INSTITUTE OF CERAMICS, CHINESE ACADEMY OF SCIENCES, Shanghai (CN)

( * ) Notice: Subject to any disclaimer, the term of this patent is extended or adjusted under 35 U.S.C. 154(b) by 262 days.

(21) Appl. No.: 12/826,008

(22) Filed: Jun. 29, 2010

(65) Prior Publication Data

US 2011/0008927 A1 Jan. 13, 2011

Related U.S. Application Data

(63) Continuation-in-part of application No. PCT/CN2008/073805, filed on Dec. 29, 2008.

(30) Foreign Application Priority Data

Dec. 29, 2007 (CN) .......................... 2007 1 0173785

(51) Int. Cl.
| | | |
|---|---|---|
| *B05D 5/12* | (2006.01) | |
| *H01L 31/032* | (2006.01) | |
| *H01L 21/02* | (2006.01) | |
| *H01L 31/18* | (2006.01) | |

(52) U.S. Cl.
CPC .... *H01L 31/0322* (2013.01); *H01L 21/02568* (2013.01); *H01L 21/02628* (2013.01); *H01L 31/1844* (2013.01); *Y02E 10/541* (2013.01); *Y02E 10/544* (2013.01)

(58) Field of Classification Search
USPC .......................................................... 427/76
See application file for complete search history.

(56) References Cited

U.S. PATENT DOCUMENTS

| | | |
|---|---|---|
| 5,730,852 A | 3/1998 | Bhattacharya et al. |
| 5,858,121 A | 1/1999 | Wada et al. |
| 6,127,202 A | 10/2000 | Kapur et al. |
| 6,268,014 B1 | 7/2001 | Eberspacher et al. |
| 7,091,136 B2 | 8/2006 | Basol |
| 7,306,823 B2 | 12/2007 | Sager et al. |
| 2005/0158909 A1 | 7/2005 | Milliron et al. |
| 2006/0121701 A1 | 6/2006 | Basol |
| 2007/0163383 A1* | 7/2007 | Van Duren et al. ............ 75/255 |
| 2007/0184576 A1* | 8/2007 | Chang .................... C23C 18/06 438/104 |
| 2007/0289624 A1 | 12/2007 | Kuriyagawa et al. |
| 2008/0057203 A1* | 3/2008 | Robinson et al. ............ 427/337 |

FOREIGN PATENT DOCUMENTS

| | | |
|---|---|---|
| CN | 101002335 | 7/2007 |
| EP | 0297799 | 1/1989 |
| EP | 2234168 | 9/2010 |
| JP | 8-316515 | 11/1996 |
| JP | 2001-357899 | 12/2001 |
| JP | 5646342 | 11/2014 |
| WO | 2007/146964 | 12/2007 |

OTHER PUBLICATIONS

Bhattacharya, "Solution Growth and Electrodeposited CuInSe2 Thin Films"; J. Electrochem.Soc.: Electrochemical Science and Technology, vol. 130, No. 10, p. 2040-2042, 1983.
Authorized Officer Tao, International Search Report issued for PCT/CN2008/073805, mailed Apr. 2, 2009 with its English translation (6 pages).
Brown et al., "Solution chemistry in the formation of single-phase CuInSe2 by spray pyrolysis," Journal of the Electrochemical Society, 1988, vol. 135, No. 6, pp. 1559-1561.

* cited by examiner

*Primary Examiner* — Austin Murata
(74) *Attorney, Agent, or Firm* — Hamre, Schumann, Mueller & Larson, P.C.

(57) ABSTRACT

A preparation method of the light absorption layer of a copper-indium-gallium-sulfur-selenium film solar cell is provided. The method employs a non-vacuum liquid-phase chemical technique, which comprises following steps: forming source solution containing copper, indium, gallium, sulfur and selenium; using the solution to form a precursor film on a substrate by a non-vacuum liquid-phase process; drying and annealing the precursor film. Thus, a compound film of copper-indium-gallium-sulfur-selenium is gained.

13 Claims, 4 Drawing Sheets

METHOD FOR PREPARING LIGHT ABSORPTION LAYER OF COPPER-INDIUM-GALLIUM-SULFUR-SELENIUM THIN FILM SOLAR CELLS

TECHNICAL FIELD

This invention relates to the field of photovoltaic cell devices, and in particular, mainly relates to the preparation method of light absorption layer of copper-indium-gallium-sulfur-selenium thin film solar cells.

BACKGROUND ART

Energy and environment issues are the two strategic problems to be addressed for the sustainable development of human race, and it is getting more and more important and urgent to exploit and utilize the clean and renewable energy. Solar energy is a kind of clean, abundant, locally available and renewable energy. It is of great significance to exploit and utilize solar energy. Solar cells are one of the most effective devices for utilizing the solar energy, among which, copper-indium-gallium-sulfur-selenium (hereafter abbreviated as CIGSS) thin film solar cells have been recognized as the most promising next generation of solar cells, which represents the advantages of low-cost, high-efficient, long-term stable, superior performance under weak illumination, and desirable resistance to radiation. However, commercial mass production of CIGSS thin film solar cells has not been realized because of the complicated conventional process for preparing the light absorption layer of CIGSS thin film solar cells, leading to a low yield rate and a high production cost.

The methods used for preparing light absorption layer of CIGSS thin film solar cells can be categorized into two classes. One is the high-vacuum vapor deposition methods, such as thermal evaporation, magnetron sputtering and molecular beam epitaxy. CIGSS thin films with small area prepared by above methods possess excellent quality, and the corresponding solar cells can exhibit very high photoelectric conversion efficiencies. As disclosed by the US National Renewable Energy Laboratory (NREL), a highest efficiency of 19.5% has been achieved with a copper-indium-gallium-selenium (hereafter abbreviated as CIGS) thin film solar cell with an effective area of 0.405 $cm^2$ prepared by the so-called three-stage co-evaporation process. However, it would be difficult to ensure the uniformity of thin films when these methods are used for the deposition of large-area thin films. Moreover, various factors such as low yield rate resulted from the complexity of those processes, high capital investment, low raw material utilization rate and low productivity, leads to a very high production cost, which prohibits the mass production of CIGSS thin film solar cells by these methods. The other type of method is a non-vacuum liquid phase methods. As compared with the conventional high vacuum vapor phase methods, substantial cost reduction can be achieved when using these non-vacuum liquid phase methods and large area thin films can be conveniently deposited. Extensive and intensive researches have been conducted in recent years as for the preparation of light absorption layer of CIGSS thin film solar cells by non-vacuum liquid phase method, which can be categorized as following:

(1) Oxide-Based Non-Vacuum Liquid Phase Method

The oxide-based non-vacuum liquid phase method comprises the following steps: (a) preparing of the liquid phase precursor of micro-particles of the oxides of copper, indium and gallium, etc., (b) coating the liquid phase precursor on substrates by various non-vacuum processes to produce precursor films, (c) reducing the precursor films under high temperature followed by selenizing them at high temperature to produce CIGS thin films. Kapur, etc. have reported an oxide-based non-vacuum liquid phase method, which was characterized in that the oxides in the liquid phase precursor were particulates with sub-micron size prepared by mechanical ball milling (See U.S. Pat. No. 6,127,202). In the method developed by Eberspacher and Pauls, the sub-micron sized complex oxides particulates which were produced by the pyrolytic decomposition of liquid drop are spayed under supersonic wave onto the substrate to obtain the precursor thin film (U.S. Pat. No. 6,268,014).

Though it is quite cost efficient to prepare light absorption layers of CIGS thin film solar cells by oxide-based non-vacuum liquid phase method, this method also exhibits great drawbacks. Firstly, it will be a waste of time and energy to reduce oxide-based precursor thin films in $H_2$ atmosphere at high temperature. Secondly, it is very hard to reduce the precursor thin films completely because of the extremely high stability of gallium oxide, which will result in a high concentration of impurities in the targeted CIGS thin films and poor doping of gallium. Lastly, thorough selenization of copper-indium-gallium alloy thin films produced by the reduction of oxides is very hard to achieve, which is due to the reaction kinetics mechanism.

(2) Spray Pyrolysis

It is quite cost efficient to prepare CIGSS thin films by spray pyrolysis method, however, high concentration of detrimental impurities, high roughness and un-uniformity in large area thin films hindered the practical utilization of this method.

It is very hard to prepare CIGS thin films qualified for the photovoltaic devices by spray pyrolysis, and solar cells prepared by this process show extremely low photoelectric conversion efficiency, which almost excludes the industrial application of this method in CIGS thin film solar cells.

(3) Electrochemical Method

Considerable attention has been attracted to the electrochemical deposition of CIGS thin films ever since the first successful deposition of $CuInSe_2$ thin films by electrochemical method reported by Bhattacharya (J. Electrochem. Soc. 130, 2040, 1983) in 1983. A two-step deposition process was also developed by Bhattacharya, which is characterized in that a copper-rich CIGS thin films were firstly deposited by electrochemical method, followed by adding additional In, Ga and Se, etc. to the films. Thus the final composition of the targeted thin films is modified so as to fulfill the criterion of solar cells. A CIGS thin film solar cell with a photoelectric conversion efficiency of 15.4% was fabricated employing the two-step deposition process, and it is by far the best performed one prepared by electrochemical deposition method.

Low cost, high utilization rate of raw materials and facile deposition of large area thin films are typical advantages of electrochemical deposition method. However, very large gaps existing between reduction potentials of Cu, In and Ga often bring about enrichment of copper, great difficulties in the stoichiometry control and high concentration of impurities in the produced thin films. Subsequent modification of the stoichiometry of thin films by PVD is usually necessary, which would lead to a sharp increase in production cost.

(4) Non-Oxide-Based Non-Vacuum Liquid Phase Method

Non-oxide-based non-vacuum liquid phase method was developed by Nanosolar corp. for preparing CIGS thin films (U.S. Pat. No. 7,306,823). This method comprises the following steps: firstly, preparing nanoparticles or quantum dots of copper or indium or gallium or selenium; secondly, coating the surface of nanoparticles or quantum dots with one or more layers of copper, indium, gallium, and selenium, etc. wherein the stoichiometry ratios between different elements in the coated nanoparticles are controlled by adjusting the composition and thickness of the coating layer; thirdly, dispersing the coated nanoparticles in a solvent to produce a slurry; fourthly, forming a precursor thin film from the slurry by a non-vacuum process such as printing, etc.; and lastly, short annealing the precursor film to produce the targeted CIGS thin films.

Low cost, high utilization rate of raw materials, applicability of flexible substrates and facile deposition of large area thin films can be readily achieved by this method. However, since nano-particles are used in this method, and parameters of the coated nanoparticles, such as particle size, size distribution, surface morphology and stoichiometry are very hard to be precisely controlled, thus resulting in unfavorable controllability, high complexity and poor reproducibility of the process.

In view of above, currently available methods for producing CIGSS thin films exhibits defects of one kind or another, which hampers the large-scale commercialization of CIGS thin film solar cells. Developing a novel method for producing CIGSS thin films that can overcome above defects would be a great impetus, and it would be of great significance to the industrialization of CIGS thin film solar cells.

SUMMARY OF INVENTION

The present invention is aimed to provide a novel method for producing light absorption layers of CIGSS thin film solar cells.

For this purpose, a novel method for preparing the absorption layer of CIGSS thin films was provided, which makes use of non-vacuum liquid phase chemical process and comprises the following steps:

(1) Forming stable source solutions of copper, indium, gallium, sulfur and selenium by dissolving chalcogenides or halides of copper, indium, gallium, and ingredients of sulfur and selenium into solvents having strong coordinating groups, adding a solution conditioner therein; wherein said ingredients of sulfur and selenium are selected from elemental sulfur and selenium, amine salts or hydrazine salts of sulfur and selenium;

(2) Producing a mixed solution of copper, indium, gallium, sulfur and selenium by mixing the source solutions obtained from step (1) according to the stoichiometry ratios of copper, indium, gallium in the formula $Cu_{1-x}In_{1-y}Ga_y Se_{2-z}S_z$ ($0 \leq x \leq 0.3$, $0 \leq y \leq 1$, $0 \leq z \leq 2$) of the light absorption layer of CIGSS thin film solar cells, together with excess sulfur and selenium;

(3) Producing precursor thin films on a substrate from the mixed solution obtained from step (2) by non-vacuum liquid phase process;

(4) Drying and annealing the precursor thin films obtained from step (3) to produce the targeted CIGSS compound thin films.

BEST MODE FOR CARRYING OUT THE INVENTION

Figure 1:
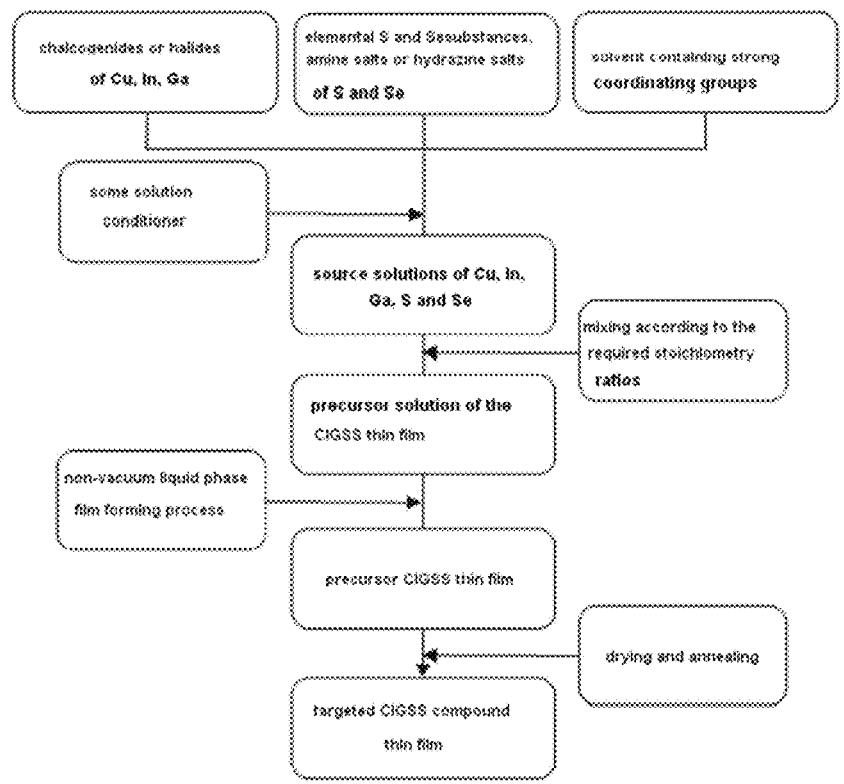
FIG. 1 is a process flow diagram for the preparation of the precursor solution of CIGSS thin films.

A great deal of experiments and investigations were conducted by inventors, and advantages can be seen apparently when employing the novel non-vacuum solution chemical method, which can be summarized as follows: simple in process, low cost, low capital investment, high utilization rate of raw materials, excellent controllability, high reproductivity, facile production of large-area and high-quality thin film as well as being favorable for large-scale production. The present invention is thus completed.

As used in the disclosure, the term "aryl" includes monocyclic aryls comprising six carbon atoms, bicyclic aryls containing ten carbon atoms and tricyclic aryls containing fourteen carbon atoms, wherein each cycle may comprise 1 to 4 substituting groups. For example, the aryls include but are not limited to phenyl, naphthyl and anthracyl.

Step 1

In Step 1 of the present invention, stable source solutions of copper, indium, gallium, sulfur and selenium are formed by dissolving chalcogenides or halides of copper, indium, gallium as well as ingredients of sulfur and selenium into solvents containing strong coordinating groups, and adding a solution conditioner therein; wherein said ingredients of sulfur and selenium are selected from elemental sulfur and selenium, amine salts or hydrazine salts of sulfur and selenium, wherein said chalcogenides of step 1 can be depicted as $M_2Q$, wherein M is copper (Cu), and Q is one or more chalcogens selected from sulfur (S), selenium (Se), tellurium (Te). For example, the representative chalcogenides include but are not limited to $Cu_2S$, $Cu_2Se$, and $Cu_2(S, Se)$, etc.;

said chalcogenides of step 1 can also be depicted as MQ, wherein M is copper (Cu), and Q is one or more chalcogens selected from sulfur (S), selenium (Se), tellurium (Te). For example, the representative chalcogenides include but are not limited to CuS, CuSe, and Cu(S, Se), etc.;

said chalcogenides of step 1 can also be depicted as $M'_2Q_3$, wherein M' is indium (In) and/or gallium (Ga), and Q is one or more chalcogens selected from sulfur (S), selenium (Se), tellurium (Te). For example, the representative chalcogenides include but are not limited to $In_2Se_3$, $Ga_2Se_3$, $(In, Ga)_2Se_3$ and $(In, Ga)_2(S, Se)_3$, etc.;

said chalcogenides of step 1 can also be depicted as $MM'Q_2$, wherein M is Cu, M' is In and/or Ga, and Q is one or more chalcogens selected from S, Se, Te. For example, the representative chalcogenides include but are not limited to $CuInS_2$, $Cu(In, Ga)Se_2$ and $Cu(In, Ga)(S, Se)_2$, etc.;

said halides of step 1 can be depicted as MX, wherein M is Cu, and X is one or more halogens selected from Cl, Br, I. For example, the representative halides include but are not limited to CuI, CuBr, and Cu(Br, I), etc.;

said halides of step 1 can also be depicted as $MX_2$, wherein M is Cu, and X is one or more halogens selected from Cl, Br, I. For example, the representative halides include but are not limited to $CuI_2$, $CuBr_2$, and $Cu(Br, I)_2$, etc.;

said halides of step 1 can also be depicted as $M'X_3$, wherein M' is In and/or Ga, and X is one or more halogens selected from Cl, Br, I. For example, the representative halides include but are not limited to $InI_3$, $GaI_3$, $(In, Ga)I_3$, and $(In, Ga)(I, Br)_3$, etc.;

said halides of step 1 can also be depicted as $MM'X_4$, wherein M is Cu, M' is In and/or Ga, and X is one or more halogens selected from Cl, Br, I. For example, the representative halides include but are not limited to $CuInI_4$, $Cu(In, Ga)I_4$, and $Cu(In, Ga)(I, Br)_4$, etc.

In Step 1, said chalcogenides and halides of copper, indium and gallium can be used separately or in combination.

In addition, it should be pointed out that said source solutions of copper, indium and gallium can be prepared separately or together. When source solutions of different elements are separately prepared, multiple separately-prepared source solutions can be blended such as, according to certain stoichiometry ratio. For example, precursor solutions of copper-indium and gallium can be separately prepared, followed by mixing the two precursor solutions to form a CIGSS thin film precursor solution when necessary.

In Step 1, the mixing ratio between said chalcogenides or halides of Cu, In, Ga and ingredients of sulfur and selenium can be adjusted according to the targeted product, that is to say, the ratio was determined according to the stoichiometry ratio of Cu, In and Ga in the light absorption layer of CIGSS thin film solar cells, $Cu_{1-x}In_{1-y}Ga_ySe_{2-z}S_z$ ($0 \leq x \leq 0.3$, $0 \leq y \leq 1$, $0 \leq z \leq 2$), wherein the ingredients of sulfur and selenium are selected from elemental sulfur and selenium, amine salts or hydrazine salts of sulfur and selenium.

In Step 1, said solvent containing strong coordinating groups include: water ($H_2O$), liquid ammonia ($NH_3$), hydrazine compounds ($R_4R_5N$—$NR_6R_7$), lower alcohol, ethanolamine, diethanolamine, triethanolamine, isopropanolamine, formamide, N-methylformamide, N,N-dimethylformamide, acetamide, N-methylacetamide, N,N-dimethylacetamide, dimethylsulfoxide, tetrahydrothiophene-1,1-dioxide, pyrrolidone, or a mixture thereof. Preferably, the solvent having strong coordinating groups is selected from the group consisting of: liquid ammonia, hydrazine compounds ($R_4R_5N$—$NR_6R_7$), diethanolamine, triethanolamine and a mixture thereof. The hydrazine compounds is represented by the formula of $R_4R_5N$—$NR_6R_7$, wherein each of $R_4$, $R_5$, $R_6$ and $R_7$ is independently selected from aryl, hydrogen, methyl, ethyl, $C_3$-$C_6$ alkyl. The lower alcohol includes: methanol, ethanol, propanol, isopropanol, butanol, isobutanol, sec-butanol, tert-butanol, pentanol, optically reactive pentanol (2-methyl-1-butanol), isopentanol, sec-pentanol, tert-pentanol and 3-methyl-2-butanol or a mixture thereof. As used in this invention, said alkyl can be linear branched alkyl. Said alkyl can also be a cyclic alkyl.

As known those skilled in the art, the solution can be stabilized by introducing solution conditioner. The solution conditioner of step 1 includes: (1) chalcogens, (2) transition elements, (3) chalcogenides of alkali metals, (4) chalcogenides of alkali earth metals, (5) amine salts of chalcogens, (6) alkali metals, (7) alkali earth metals. The chalcogens are selected from the group consisting of S, Se, Te and a combination thereof; the transition elements are selected from the groups consisting of: nickel (Ni), palladium (Pd), platinum (Pt), rhodium (Rh), iridium (Ir), ruthenium (Ru) and a combination thereof; the chalcogenides of alkali metals include $A_2Q$, wherein A is selected from the group consisting of: Li, Na, K, Rb, Cs and a combination thereof, and Q is selected from the group consisting of: S, Se, Te and a combination thereof; the chalcogenides of alkali earth metals includes BQ, wherein B is selected from the group consisting of: Mg, Ca, Sr, Ba and a combination thereof, and Q is selected from the group consisting of: S, Se, Te and a combination thereof; the amine salts of chalcogens include one or a mixture of the salts formed by hydrogen sulfide ($H_2S$), hydrogen selenide ($H_2Se$) or hydrogen telluride ($H_2Te$) with N—$R_1R_2R_3$ ($R_1$, $R_2$, $R_3$ is independently selected from aryl, hydrogen, methyl, ethyl, $C_3$-$C_6$ alkyl), the alkali metals are selected from the group consisting of: elemental Li, Na, K, Rb and Cs, and alloys or mixtures thereof; the alkali earth metals are selected from the group consisting of elemental Mg, Ca, Sr and Ba, and alloys or mixtures thereof.

It should be noted that the solution conditioner may be unnecessary if the source solution is adequately stable, and the amount of the solution conditioner added to the solution is variable as long as the stability of the solution is ensured. This is well known to those skilled in the art.

The solution conditioner can be separated from the solution. For example, the solution conditioner can be separated from the solution by filtration. It should be understood that some remaining solution conditioners will not exert any influence on the performance of the targeted products, which excludes the necessity of separation.

Step 2

In Step 2, the source solutions prepared in Step 1 are mixed according to the stoichiometry ratio of copper, indium, gallium of the light absorption layer of CIGSS thin film solar cell, $Cu_{1-x}In_{1-y}Ga_ySe_{2-z}S_z$ ($0 \leq x \leq 0.3$, $0 \leq y \leq 1$, $0 \leq z \leq 2$), with excess sulfur and/or selenium to produce a mixed solution of copper, indium, gallium, sulfur and selenium.

Preferably, in the formula of $Cu_{1-x}In_{1-y}Ga_ySe_{2-z}S_z$, $0 \leq x \leq 0.3$, $0.2 \leq y \leq 0.4$, $0 \leq z \leq 0.2$.

With regard to step 2, the excess degree of sulfur and/or selenium is 0%-800%, preferably 100%-400%. The degree of excess depends on the targeted CIGSS thin film. In another word, the relation of the source elements in the mixed solution of the Cu, In, Ga, S and Se, may be illustrated as in the following formula:

$$1 \leq (S+Se)/M \leq 9, \text{ preferably, } 1 \leq (S+Se)/M \leq 5,$$

wherein the (S+Se)/M refers to the mole ratio of the total amount of the S and Se to the total amount of the Cu, In and Ga, i.e. the (S+Se)/M equal to 1 when the elements of the CIGSS thin film solar cell has a stoichiometry mole ration.

The mole ratio of the total amount of S to the total amount of S and Se in the mixed solution of Cu, In, Ga, S and Se ranges from 0 to 1,i.e. $0 \leq S/(S+Se) \leq 1$, preferably, $0 \leq S/(S+Se) \leq 0.4$, more preferably, $0 \leq S/(S+Se) \leq 0.3$.

For example, if a solution of Cu, In, Ga, S and Se contains 1 mmol S, 2 mmol Se, 1 mmol Cu, 0.7 mmol In, 0.3 mmol Ga, it means that (S+Se)/M=1.5, S/(S+Se)=0.33, i.e., if the (S+Se)/M=1.5, it means the total amount of the S and Se is in an excess of 50%.

The present invention further provides a preferred embodiment as follows:

providing a mixed solution of Cu, In, Ga, S and Se, wherein the mole ratio of the total amount of S and Se to the total amount of Cu, In and Ga ranges from 1.75 to 5, and the mole ratio of the total amount of S to the total amount of S and Se ranges from 0 to 0.4, preferably 0 to 0.3. After continuing research, the inventor found that when the contents of the mixed solution of Cu, In, Ga, S and Se are refined to a certain range, the CIGSS thin film solar cell achieved more satisfactory performance.

Step 3

In Step 3, the mixed solution prepared in Step 2 is applied onto a substrate through a non-vacuum liquid phase process to produce the precursor thin films.

Wherein said non-vacuum processes used for step 3 include: (1) spin-coating, (2) tape-casting, (3) spray-deposition, (4) dip-coating, (5) screen-printing, (6) ink-jet printing, (7) drop-casting, (8) roller-coating, (9) slot die coating, (10) Meiyerbar coating, (11) capillary coating, (12) Comma-coating, (13) gravure-coating, etc.

The substrates used for step 3 include: polyimide, Si wafer, amorphous hydrogenated silicon wafer, silicon carbide, silica, quartz, sapphire, glass, metal, diamond-like carbon, hydrogenated diamond-like carbon, gallium nitride (GaN), gallium arsenide, germanium, Si—Ge alloys, ITO, boron carbide, silicon nitride, alumina, ceria, tin oxide, zinc titanate, plastic and so on.

Step 4

In Step 4, the precursor thin films prepared in Step 3 are dried and annealed to produce the targeted CIGSS thin films.

In step 4, the procedure of drying is carried out at a temperature of room temperature to 80° C., though other temperature can also be adopted as long as it is sufficient to achieve the final target.

The annealing is carried out at a temperature of 50° C. to 850° C., preferably at a temperature of 250° C. to 650° C.

The composition of the targeted CIGSS thin film is $Cu_{1-x}In_{1-y}Ga_ySe_{2-z}S_z$, wherein $0 \leq x \leq 0.3$, $0 \leq y \leq 1$ and $0 \leq z \leq 2$.

The thickness of the targeted CIGSS thin film can be adjusted as required. For example, the thickness can be 5-5000 nm, and preferably, 100-3000 nm.

The present invention further provides a preferred embodiment as follows:

the precursor thin film was annealed in Se atmosphere at a temperature of 450-600° C. for 10 to 60 minutes, and in S atmosphere at a temperature of 350-550° C. for 10 to 60 minutes.

After continuing research, the inventor found that when precursor thin film is treated by particular annealing atmosphere, as a result, the CIGSS thin film solar cell achieved more satisfactory performance.

ADVANTAGES

The non-vacuum liquid phase chemical process for preparing light absorption layers of CIGSS thin film solar cells provided by the present invention exhibits the following advantages over those conventional high-vacuum vapor phase methods: simple in process, low cost, favorable controllability, high reproducibility, production of large-area and high-quality thin film and favorable for large-scale production, low capital investment and high utilization rate of raw materials, which leading to substantial decrease in production cost of CIGSS thin film solar cells, and will boosting the rapid development of CIGSS thin film solar cell industrialization.

Moreover, as compared with the non-vacuum liquid phase methods of the prior art, the process provided by the present invention will not be hindered by the following shortcomings: incomplete selenization of the precursor thin film occurred in the oxide-based non-vacuum liquid method, the complexity in the controlling of the coated nano-particles encountered in the non-oxide-based non-vacuum liquid phase process as developed by Nanosolar, the difficulties in the stoichiometry-control of the thin film in electrochemical deposition methods, or the highly-concentrated impurities in the thin film prepared by spray pyrolysis.

Accurate control and continuous adjustment of the stoichiometry of the targeted CIGSS thin film at atomic scale can be readily reached by the method provided in this invention, and the distribution of elements can also be facilely achieved through fabricating multi-layer thin films and adjusting the chemical composition in each layer.

The method provided by this invention is characterized by: low annealing temperature, inhomogeneous composition in the resulted thin film, high surface smoothness, high crystallinity, favorable orientation degree, low concentration of impurities, applicable to various substrates (including polyimide and other organic flexible substrates) and facile to control the stoichiometry and element distribution in the film, which facilitates the fabrication of large-area and high-quality CIGSS thin films. Furthermore, the utilization rate of the raw materials of Cu, In, Ga, S and Se, etc. can be up to 100%.

Other technological aspects of this invention will be apparent to those skilled in the art after reviewing the disclosure of the present invention.

Hereinafter, further description of the present invention will be provided through specific embodiments. It should be noted that these embodiments are merely used for explaining rather than restricting the range of the present invention. The experiment processes without indication of specific operational parameters in the following embodiments are carried out under regular conditions, or follow the conditions recommended by the manufacturer. All terms of the portion and percentage used in this invention are in weight unless otherwise specified.

All the technical terms used in this invention are in the same meanings with those familiar to those skilled in the relevant art unless otherwise specified. In addition, any similar or equivalent methods or materials can be applied in present invention.

Example 1

1. Preparation of the precursor solution of CIGSS thin film (a) Preparation of the solution comprising Cu and In 1 mmol $Cu_2(S,Se)$, 0.5 mmol $In_2Se_3$, 0.2 mmol $InI_3$, 0~8 mmol S and 0~8 mmol Se were added into 2~16 ml mixed solvents composed of methyl hydrazine, ethanolamine and dimethyl sulfoxide, wherein the volume ratio was methyl hydrazine:ethanolamine:dimethyl sulfoxide=1~3:1~6:1~8. The mixture was agitated to produce a clear solution.

(b) Preparation of the solution containing Ga 0.6 mmol $Ga_2Se_3$, 0.3 mmol $GaBr_3$, 0.1 mmol $GaI_3$, 0~8 mmol Se and a trace of Ru powders were added into a 1~8 ml mixed solvents composed of methyl hydrazine, ethanolamine and dimethyl sulfoxide, wherein the volume ratio was methyl hydrazine:ethanolamine:dimethyl sulfoxide=1~3:1~6:1~8. The mixture was sufficiently agitated and filtrated through a 0.2 μm filter to produce a clear solution comprising Ga.

(c) Preparation of the precursor solution of CIGSS thin film

Above solutions comprising Cu/In and Ga are metered and blended at a volume ratio according to the stoichiometry ratios of Cu, In and Ga in the targeted CIGSS thin film to produce the precursor solution of CIGSS thin film.

2. Preparation of CIGSS thin film

Above precursor solution of CIGSS thin film is applied onto a substrate through a non-vacuum film-forming process (selected from spin-coating, tape-casting, stamping and printing, etc) to fabricate a precursor CIGSS thin film. After drying under low temperature (room temperature~80° C.), the precursor CIGSS thin film was rapidly annealed under high temperature (250° C.~650° C.) to form CIGSS thin film.

3. Characterization of CIGSS thin film (a) Phase characterization

Figure 2:
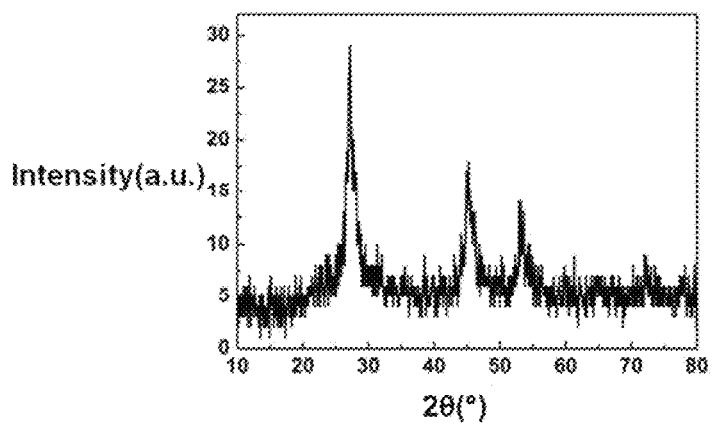
FIG. 2 is the X-ray diffraction pattern of CIGSS powder prepared by drying the precursor solution of CIGSS thin film at 160° C.
Figure 3:
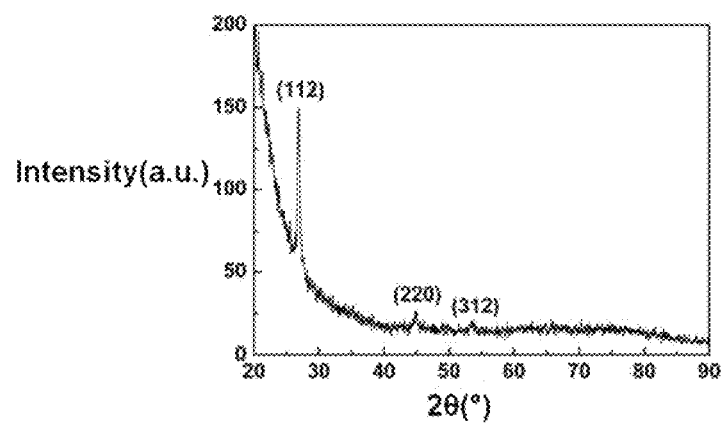
FIG. 3 is the X-ray diffraction pattern of CIGSS thin film formed on a quartz substrate.

The CIGSS precursor solution was dried at 120° C.~200° C. under flow of dried inert gas to form black powders, which was characterized by X-ray diffraction (XRD) (as shown in FIG. 2). The result showed that the powder was CIGSS. The CIGSS thin film formed on quartz substrate was also characterized by XRD (as shown in FIG. 3), the XRD pattern showed that the thin film was CIGSS will a relatively strong (112) orientation.

(b) Electrical properties

The electrical properties of the thin film were measured by a four-electrode method on Accent HL5500 Hall System. The results (as shown in Table 1) illustrated that the as-prepared CIGSS thin film fulfilled the criterion of CIGSS thin film solar cell device.

TABLE 1

| Sample | Carrier concentration ($cm^{-3}$) | Carrier mobility ($cm^{-2} V^{-1} s^{-1}$) |
|---|---|---|
| CIGSS | $1.5 \times 10^{17}$ | 1.12 |

(c) Optical properties

Figure 4:
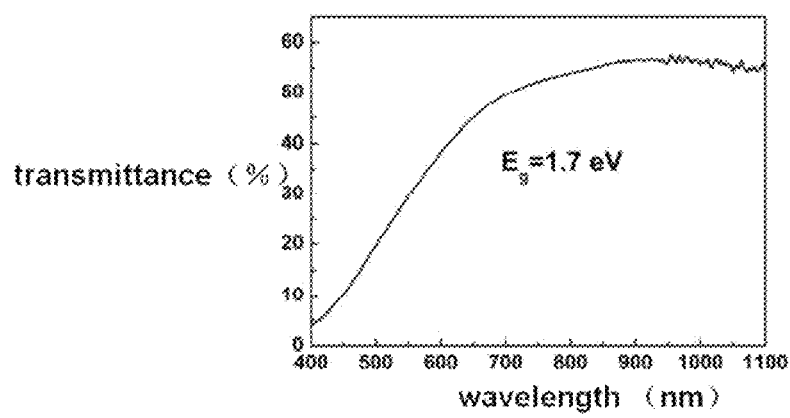
FIG. 4 is the UV-Vis transmittance spectrum of CIGSS thin film formed on a quartz substrate.

The UV-Vis transmittance spectrum of the CIGSS thin film formed on quartz substrate was measured. The results (as shown in FIG. 4) showed that the band gap of the CIGS thin film could meet the requirement of CIGS solar cell devices.

(d) Characterization of the microstructure

Figure 5:
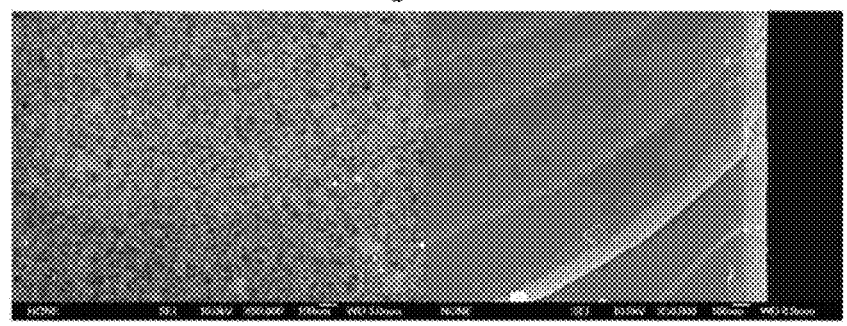
FIG. 5 is a front view and cross-sectional view scanning electron microscopy (SEM) image of the CIGSS thin film formed on a quartz substrate.
Figure 6:
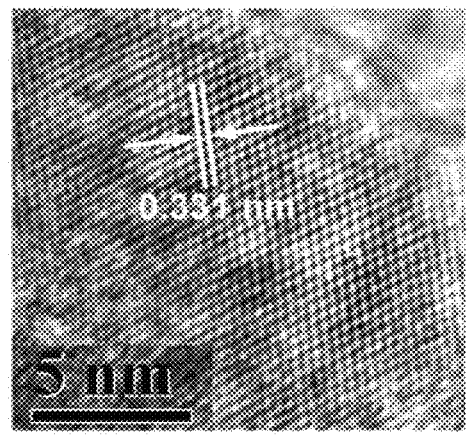
FIG. 6 is a high resolution transmission electron microscopy (HRTEM) image of CIGSS thin film.

The microstructure of the as-formed CIGSS thin film was characterized. The left part of FIG. 5 was a front-view SEM image, and the right part was a cross-sectional SEM image of the CIGSS thin film. The as-prepared CIGSS thin film is characterized by excellent surface smoothness, homogeneous composition and high crystallinity, as shown in FIG. 5. FIG. 6 was a high resolution transmission electron microscopy (HRTEM) image of CIGSS thin film, which further illustrated that CIGSS thin film was well crystallized, and the lattice plane spacing is 0.331 nm, which is consistent with the spacing between the (112) lattice planes of CIGSS crystal structure.

4. Fabrication of CIGSS thin film solar cell

Figure 7:
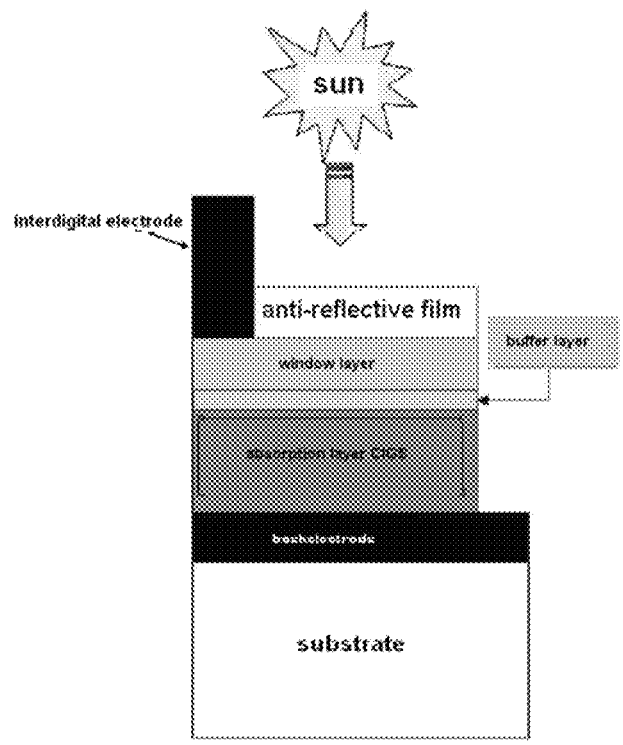
FIG. 7 is a schematic diagram showing the structure of CIGSS thin film solar cell.

The CIGSS thin film solar cell, which had a device structure as shown in FIG. 7, was prepared by a serial of steps as follows: firstly, a buffer layer was deposited onto the CIGSS thin film to a thickness of about 50 nm; then the window layer and interdigital electrode were prepared; finally, an anti-reflective film was deposited. A photoelectric conversion efficiency of 13% could be achieved with the as-fabricated CIGSS thin film solar cell having an aperture area of 1.5 $cm^2$ after optimization.

Example 2

1. Preparation of the precursor solution of CIGSS thin film (a) Preparation of the solution containing Cu 1 mmol CuI was added into 2~16 ml ethylene glycol. The mixture was sufficiently agitated to produce a clear solution.

(b) Preparation of the solution containing In 1 mmol indium iodide and 0~8 mmol Se were added into 1~8 ml mixed solvents composed of methyl hydrazine and n-butanol, wherein the volume ratio was methyl hydrazine:n-butanol=1~3:1~8. The mixture was sufficiently agitated and filtrated through a 0.2 μm filter to produce a clear solution containing In.

(c) Preparation of the solution containing Ga 1 mmol $GaI_3$ and 4~8 mmol Se were added into 1~8 ml mixed solvents composed of methyl hydrazine and n-butanol, wherein the volume ratio was methyl hydrazinem-butanol=1~3:1~8. The mixture was sufficiently agitated and filtrated through a 0.2 μm filter to produce a clear solution containing Ga.

(d) Preparation of the precursor solution of CIGSS thin film

Above solutions comprising Cu, In and Ga are metered and blended at a volume ratio according to the stoichiometry ratios of Cu, In and Ga in the targeted CIGSS thin film to produce the precursor solution of CIGSS thin film.

2. Preparation of CIGSS thin film

Above precursor solution of CIGSS thin film is applied onto a substrate through a non-vacuum film-forming process (for example, spin-coating, tape-casting, stamping and printing, etc) to fabricate a precursor CIGSS thin film. After drying under low temperature (room temperature~80° C.), the precursor CIGSS thin film was rapidly annealed under high temperature (250° C.~650° C.) to form CIGSS thin film.

3. Characterization of CIGSS thin film (a) Phase characterization was carried out by following the procedures of example 1 and the results were similar with that of example 1.

(b) Electric properties were characterized by following the procedures of example 1 and the results were similar with that of example 1.

(c) Optical properties were characterized by following the procedures of example 1 and the results were similar with that of example 1.

(d) Microstructure was characterized by following the procedures of example 1 and the results were similar with that of example 1.

4. The CIGSS thin film solar cell was fabricated by following the procedures of example 1 and the measured results were similar with that of example 1.

Example 3

1. Preparation of the precursor solution of CIGSS thin film (a) Preparation of the solution containing Cu and Se 1 mmol CuCl was added into 2~16 ml mixed solvents composed of ethylene diamine, dodecyl mercaptan and N,N-dimethyl formamide, wherein volume ratio was ethylene diamine:dodecyl mercaptan:N,N-dimethyl formamide=1~8:1~3:1~6. The mixture was sufficiently agitated to produce a clear solution containing copper. Then 2-6 mmol Se was added into 4-16 ml ethylene diamine, and the mixture was sufficiently agitated and refluxed under 80° C. to produce a clear solution of selenium in ethylene diamine.

The ethylene diamine solution of selenium was added in above solution containing Cu under agitation to produce the solution containing Cu and Se.

(b) Preparation of the solution containing In 1 mmol indium iodide $InI_3$ was added into 2~16 ml mixed solvents composed of ethanol and isopropanol, wherein the volume ratio was ethanol isopropanol=1~3:1~6. The mixture was sufficiently agitated to produce a clear solution containing In.

(c) Preparation of the solution containing Ga 1 mmol $GaI_3$ was added into 2~16 ml mixed solvents composed of ethanol and isopropanol, wherein the volume ratio was ethanol:isopropanol=1~3:1~6. The mixture was sufficiently agitated to produce a clear solution containing Ga.

(d) Preparation of the precursor solution of CIGSS thin film

The precursor solution of CIGSS thin film was formulated by following the procedures of example 1.

2. Preparation of CIGSS thin film

The CIGSS thin film was prepared by following the procedures of example 1.

3. Characterization of CIGSS thin film (a) Phase characterization was carried out by following the procedures of example 1 and the results were similar with that of example 1.

(b) Electric properties were characterized by following the procedures of example 1 and the results were similar with that of example 1.

(c) Optical properties were characterized by following the procedures of example 1 and the results were similar with that of example 1.

(d) Microstructure was characterized by following the procedures of example 1 and the results were similar with that of example 1.

4. The CIGSS thin film solar cell device was fabricated by following the procedures of example 1 and the measured results were similar with that of example 1.

Example 4

1. Preparation of the precursor solution of CIGSS thin film (a) Preparation of the solution containing Cu 1 mmol CuCl was added into 2~16 ml mixed solvents composed of ethylene diamine, dodecyl mercaptan and N,N-dimethyl formamide, wherein volume ratio was ethylene diamine:dodecyl mercaptan:N,N-dimethyl formamide=1~8:1~3:1~6. The mixture was sufficiently agitated to produce a clear solution containing copper. Then 2-6 mmol Se was added into 4-16 ml dimethyl hydrazine, and the mixture was sufficiently agitated to produce a clear solution of selenium in dimethyl hydrazine. The dimethyl hydrazine solution of selenium was added in above solution containing Cu under agitation to produce the solution containing Cu and Se.

(b) Preparation of the solution containing In and Ga 1 mmol $(In, Ga)I_3$ was added into 2~16 ml mixed solvents composed of ethanol and isopropanol, wherein the volume ratio was ethanol:isopropanol=1~3:1~6. The mixture was sufficiently agitated to produce a clear solution containing In and Ga.

(c) Preparation of the precursor solution of CIGSS thin film

The precursor solution of CIGSS thin film was formulated by following the procedures of example 1.

2. Preparation of CIGSS thin film

The CIGSS thin film was prepared by following the procedures of example 1.

3. Characterization of CIGSS thin film (a) Phase characterization was carried out by following the procedures of example 1 and the results were similar with that of example 1.

(b) Electric properties were characterized by following the procedures of example 1 and the results were similar with that of example 1.

(c) Optical properties were characterized by following the procedures of example 1 and the results were similar with that of example 1.

(d) Microstructure was characterized by following the procedures of example 1 and the results were similar with that of example 1.

4. The CIGSS thin film solar cell device was fabricated by following the procedures of example 1 and the measured results were similar with that of example 1.

Example 5

1. Preparation of the precursor solution of CIGSS thin film (a) Preparation of the solution containing Cu 1 mmol CuS and 2 mmol $(NH_4)_2S$ were added into 2~16 ml mixed solvents composed of triethanolamine, hydrazine hydrate and dimethyl sulfoxide, wherein volume ratio was triethanolamine:hydrazine hydrate:dimethyl sulfoxide=1~8:1~3:1~6. The mixture was sufficiently agitated to produce a clear solution containing copper. Then 2-6 mmol Se was added into 4-16 ml hydrazine hydrate, and the mixture was sufficiently agitated and refluxed under 80° C. to produce a clear solution of selenium in hydrazine hydrate. The hydrazine hydrate solution of selenium was added in above solution containing Cu under agitation to produce the solution containing Cu and Se.

(b) Preparation of the solution containing In and Ga 1 mmol $(In, Ga)I_3$ was added into 2~16 ml mixed solvents composed of ethanol and isopropanol, wherein the volume ratio was ethanol:isopropanol=1~3:1~6. The mixture was sufficiently agitated to produce a clear solution containing In and Ga.

(c) Preparation of the precursor solution of CIGSS thin film

The precursor solution of CIGSS thin film was formulated by following the procedures of example 1.

2. Preparation of CIGSS thin film

The CIGSS thin film was prepared by following the procedures of example 1.

3. Characterization of CIGSS thin film (a) Phase characterization was carried out by following the procedures of example 1 and the results were similar with that of example 1.

(b) Electric properties were characterized by following the procedures of example 1 and the results were similar with that of example 1.

(c) Optical properties were characterized by following the procedures of example 1 and the results were similar with that of example 1.

(d) Microstructure was characterized by following the procedures of example 1 and the results were similar with that of example 1.

4. The CIGSS thin film solar cell device was fabricated by following the procedures of example 1 and the measured results were similar with that of example 1.

Example 6

1. Preparation of the precursor solution of CIGSS thin film (a) Preparation of the solution containing Cu 1 mmol CuInSe$_2$ and 2 mmol (NH$_4$)$_2$S were added into 2~16 ml mixed solvents composed of ethylene diamine, anhydrous hydrazine and dimethyl sulfoxide, wherein volume ratio was ethylene diamine:anhydrous hydrazine:dimethyl sulfoxide=1~3:1~8:1~6. The mixture was sufficiently agitated under low temperature and filtered with a 0.2 μm filtrate to produce a clear solution containing copper.

(b) Preparation of the solution containing In and Ga 1 mmol (In, Ga)$_2$Se$_3$ was added into 2~16 ml mixed solvents composed of ethylene diamine and anhydrous hydrazine, wherein the volume ratio was ethylene diamine: anhydrous hydrazine=1~3:1~6. The mixture was sufficiently agitated to produce a clear solution containing In and Ga.

(c) Preparation of the precursor solution of CIGSS thin film

The precursor solution of CIGSS thin film was formulated by following the procedures of example 1.

2. Preparation of CIGSS thin film

The CIGSS thin film was prepared by following the procedures of example 1.

3. Characterization of CIGSS thin film (a) Phase characterization was carried out by following the procedures of example 1 and the results were similar with that of example 1.

(b) Electric properties were characterized by following the procedures of example 1 and the results were similar with that of example 1.

(c) Optical properties were characterized by following the procedures of example 1 and the results were similar with that of example 1.

(d) Microstructure was characterized by following the procedures of example 1 and the results were similar with that of example 1.

4. The CIGSS thin film solar cell device was fabricated by following the procedures of example 1 and the measured results were similar with that of example 1.

Example 7

1. Preparation of the precursor solution of CIGSS thin film (a) Preparation of the solution containing Cu 1 mmol CuI was added into 4 ml ethanediamine, and was sufficiently agitated under low temperature to produce a clear solution containing Cu.

(b) Preparation of the solution containing In 1 mmol InI$_3$ was added into 4 ml methanol, and was sufficiently agitated to produce a clear solution containing In.

(c) Preparation of the solution containing Ga 1 mmol GaI$_3$ was added into 4 ml methanol, and was sufficiently agitated to produce a clear solution containing In.

(d) Preparation of the solution containing S 8 mmol S was added into 8 ml ethanediamine, and was sufficiently agitated under low temperature to produce a clear solution containing S.

(e) Preparation of the solution containing Se 8 mmol Se was added into 16 ml ethanediamine, and was sufficiently agitated under low temperature to produce a clear solution containing Se.

(f) Preparation of the precursor solution of CIGSS thin film 3.6 ml solution containing Cu, 2.8 ml solution containing In, 1.2 ml solution containing Ga, 3 ml solution containing S and 0 ml solution containing Se are metered and blended under a temperature of 10° C. to produce the precursor solution of CIGSS thin film.

2. Preparation of CIGSS thin film

Firstly, drop the above precursor solution of CIGSS thin film onto a Mo-coated glass and spin it at a high speed of 3000 rpm for 45 s after a pre-spin of 6 s at a low speed of 1000 rpm to produce a precursor CIGSS thin film. Anneal the precursor CIGSS thin film at 300° C. for 5 min and cool it down to room temperature, thus a layer of CIGSS thin film was gotten. Repeat the above procedure for another 9 times, and a 1.4 μm thick CIGSS thin film was fabricated. Anneal the gotten 1.4 μm thick CIGSS thin film at 550° C. for 25 min under high pure nitrogen gas (N$_2$), a device-quality CIGSS thin film was prepared, which can be served as the light absorption layer of CIGSS thin film solar cell.

3. The CIGSS thin film solar cell was fabricated by following the procedures of example 1 and a photoelectric conversion efficiency of 4.97% was achieved.

Example 8

The steps of (a), (b), (c), (d), (e) in the preparation of the precursor solution of CIGSS thin film were the same with example 7, and the step of (f) was: 3.6 ml solution containing Cu, 2.8 ml solution containing In, 1.2 ml solution containing Ga, 1.5 ml solution containing S and 3 ml solution containing Se are metered and blended under a temperature of 10° C. to produce the precursor solution of CIGSS thin film.

Other steps of the process were the same with example 7.

The as-fabricated CIGSS thin film solar cell has a photoelectric conversion efficiency of 7.52%.

Example 9

The steps of (a), (b), (c), (d), (e) in the preparation of the precursor solution of CIGSS thin film were the same with example 7, and the step of (f) was: 3.6 ml solution containing Cu, 2.8 ml solution containing In, 1.2 ml solution containing Ga, 0.6 ml solution containing S and 4.8 ml solution containing Se are metered and blended under a temperature of 10° C. to produce the precursor solution of CIGSS thin film.

Other steps of the process were the same with example 7.

The as-fabricated CIGSS thin film solar cell has a photoelectric conversion efficiency of 9.4%.

Example 10

The steps of (a), (b), (c), (d), (e) in the preparation of the precursor solution of CIGSS thin film were the same with example 7, and the step of (f) was: 3.6 ml solution containing Cu, 2.8 ml solution containing In, 1.2 ml solution containing Ga, 0 ml solution containing S and 6 ml solution containing Se are metered and blended under a temperature of 10° C. to produce the precursor solution of CIGSS thin film.

Other steps of the process were the same with example 7.

The as-fabricated CIGSS thin film solar cell has a photoelectric conversion efficiency of 9.1%.

Example 11

The steps of (a), (b), (c), (d), (e) in the preparation of the precursor solution of CIGSS thin film were the same with example 7, and the step of (f) was: 3.6 ml solution containing Cu, 2.8 ml solution containing In, 1.2 ml solution containing Ga, 1.2 ml solution containing S and 9.6 ml solution containing Se are metered and blended under a temperature of 10° C. to produce the precursor solution of CIGSS thin film.

Other steps of the process were the same with example 7.

The as-fabricated CIGSS thin film solar cell has a photoelectric conversion efficiency of 13.2%.

Example 12

The steps of (a), (b), (c), (d), (e) in the preparation of the precursor solution of CIGSS thin film were the same with example 7, and the step of (f) was: 3.6 ml solution containing Cu, 2.8 ml solution containing In, 1.2 ml solution containing Ga, 2 ml solution containing S and 16 ml solution containing Se are metered and blended under a temperature of 10° C. to produce the precursor solution of CIGSS thin film.

Other steps of the process were the same with example 7.

The as-fabricated CIGSS thin film solar cell has a photoelectric conversion efficiency of 10.6%.

Example 13

The steps of (a), (b), (c), (d), (e) in the preparation of the precursor solution of CIGSS thin film were the same with example 7, and the step of (f) was: 3.6 ml solution containing Cu, 2.8 ml solution containing In, 1.2 ml solution containing Ga, 3.6 ml solution containing S and 28.8 ml solution containing Se are metered and blended under a temperature of 10° C. to produce the precursor solution of CIGSS thin film.

Other steps of the process were the same with example 7.

The as-fabricated CIGSS thin film solar cell has a photoelectric conversion efficiency of 7.4%.

Example 14

1. Preparation of the precursor solution of CIGSS thin film (a) Preparation of the solution containing Cu 0.5 mmol $Cu_2S$ and 1 mmol $(NH_4)_2S$ was added into 4 ml methyl hydrazine, and sufficient ammonia gas $NH_3$ was introduced into the mixture, as well as 10 μmol $Na_2S$ was added as solution conditioner. After a sufficient stirring, a clear solution containing Cu was produced.

The steps of (b), (c), (d), (e), (f) in the preparation of the precursor solution of CIGSS thin film were the same with example 11.

2. Preparation of CIGSS thin film

Firstly, drop the above precursor solution of CIGSS thin film onto a Mo-coated glass and spin it at a high speed of 3000 rpm for 45 s after a pre-spin of 6 s at a low speed of 1000 rpm to produce a precursor CIGSS thin film. Anneal the precursor CIGSS thin film at 300° C. for 5 min and cool it down to room temperature, thus a layer of CIGSS thin film was gotten. Repeat the above procedure for another 9 times, and a 1.4 μm thick CIGSS thin film was fabricated.

3. Annealing of CIGSS thin film

Annealing the gotten 1.4 μm thick CIGSS thin film at 550° C. for 15 min under a saturated Se atmosphere, a device-quality CIGSS thin film was prepared, which can be served as the light absorption layer of CIGSS thin film solar cell.

4. The CIGSS thin film solar cell was fabricated by following the procedures of example 1 and a photoelectric conversion efficiency of 14.0% was achieved.

Example 15

1. The precursor solution of CIGSS thin film and the CIGSS thin film were fabricated by following the procedures of example 14.

2. Annealing of CIGSS thin film

Annealing the gotten 1.4 μm thick CIGSS thin film at 550° C. for 15 min under a saturated Se atmosphere, followed by a subsequent annealing at 475° C. for 25 min under a saturated S atmosphere, a device-quality CIGSS thin film was prepared, which can be served as the light absorption layer of CIGSS thin film solar cell.

Figure 8:
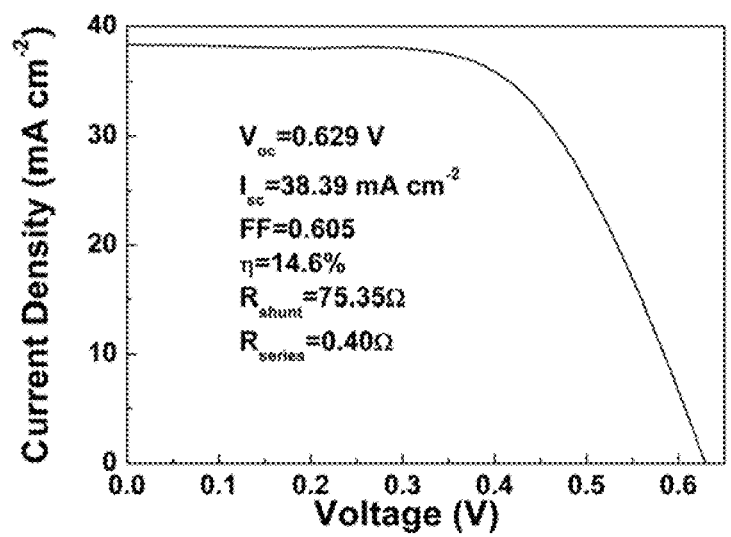
FIG. 8 is a schematic diagram showing the efficiency of the present CIGSS thin film solar cell.

3. The CIGSS thin film solar cell was fabricated by following the procedures of example 1 and a photoelectric conversion efficiency of 14.6% was achieved, as illustrated in FIG. 8.

Figure 9:
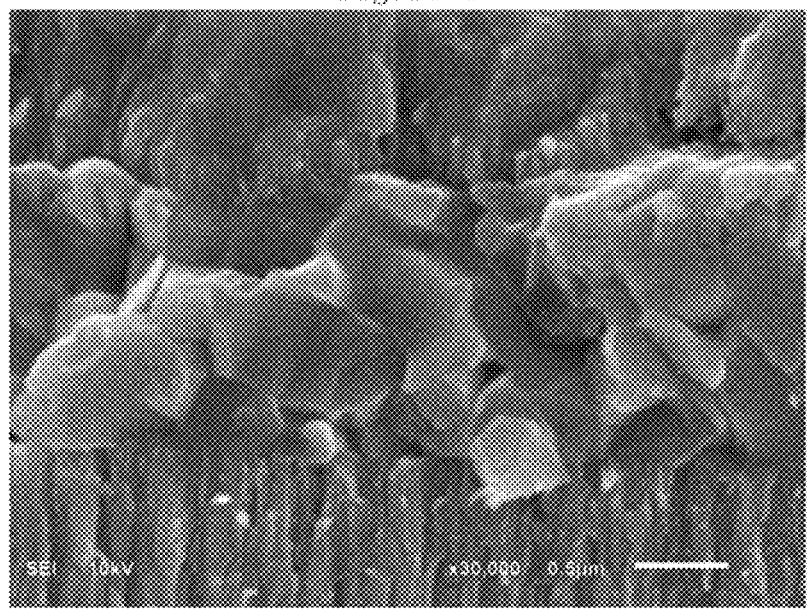
FIG. 9 is a schematic diagram showing the SEM image of the present CIGSS thin film solar cell.

4. As illustrated in FIG. 9 is the scanning electron microscopy image of the as-fabricated CIGSS thin film solar cell device.

Example 16

The steps of (a) in the preparation of the precursor solution of CIGSS thin film was: 0.5 mmol $Cu_2S$ and 1 mmol $(NH_4)_2S$ was added into 4 ml methyl hydrazine, and sufficient ammonia gas $NH_3$ was introduced into the mixture, as well as 10 μmol BaS was added as solution conditioner. After a sufficient stirring, a clear solution containing Cu was produced.

The steps of (b), (c), (d), (e), (f) in the preparation of the precursor solution of CIGSS thin film were the same with example 14.

Other steps of the process were the same with example 14.

The as-fabricated CIGSS thin film solar cell has a photoelectric conversion efficiency of 13.8%.

Example 17

1. The precursor solution of CIGSS thin film and the CIGSS thin film were fabricated by following the procedures of example 14.

2. Annealing of CIGSS thin film

Annealing the gotten 1.4 μm thick CIGSS thin film at 550° C. for 15 min under high pure nitrogen gas ($N_2$), a device-quality CIGSS thin film was prepared, which can be served as the light absorption layer of CIGSS thin film solar cell.

3. The CIGSS thin film solar cell was fabricated by following the procedures of example 1 and a photoelectric conversion efficiency of 13.4% was achieved.

The invention claimed is:

1. A method for preparing a light absorption layer of copper-indium-gallium-sulfur-selenium (CIGSS) thin film solar cell, through a non-vacuum liquid phase process, the method comprising the steps of:

(1) forming stable clear source solutions of Cu, In, Ga, S, and Se, including (a) forming stable clear source solutions of Cu by dissolving halides of Cu into a solvent selected from the group consisting of at least one of liquid ammonia, ethanolamine, diethanolamine, triethanolamine, isopropanolamine, formamide, N-methylformamide, N,N-dimethylformamide, acetamide, N-methylacetamide, N,N-dimethylacetamide, dimethylsulfoxide, tetrahydrothiophene-1,1-dioxide, pyrrolidone, and a mixture thereof, and adding a solution conditioner therein, wherein said solution conditioner is selected from the group consisting of at least one of chalcogenide of alkali metal and chalcogenide of alkali earth metal;

(b) forming stable clear source solutions of In and Ga by dissolving halides of In and Ga into a solvent selected from the group consisting of at least one of methanol, ethanol, propanol, isopropanol, butanol, isobutanol, sec-butanol, tert-butanol, pentanol, 2-methyl-1-butanol, isopentanol, sec-pentanol, tert-pentanol, 3-methyl-2-butanol, and a mixture thereof; and (c) forming stable clear source solutions of S and Se by dissolving ingredients of sulfur and selenium into a solvent selected from the group consisting of at least one of ethanolamine, diethanolamine, triethanolamine, isopropanolamine, formamide, N-methyl-formamide, N,N-dimethylformamide, acetamide, N-methylacetamide, N,N-dimethylacetamide, and a mixture thereof, wherein said ingredients of sulfur and selenium are selected from the group consisting of at least one of elemental S and Se, amine salts or hydrazine salts of S and Se;

(2) producing a mixed clear solution of Cu, In, Ga, S, and Se by mixing said stable clear source solutions obtained from (1) according to the stoichiometry ratios of Cu, In, and Ga in formula $Cu_{1-x}In_{1-y}Ga_ySe_{2-z}S_z$ of the light absorption layer of said CIGSS thin film solar cell, and excess sulfur and/or selenium, wherein $0 \leq x \leq 0.3$, $0 \leq y \leq 1$, $0 \leq z \leq 2$, and the excess degree of S or Se is 0%-800%;

(3) using said mixed clear solution of (2) to form a precursor thin film on a substrate through a non-vacuum liquid phase process; and (4) drying and annealing said precursor thin film of (3) to produce a CIGSS compound thin film.

2. The method of claim 1, wherein
said halide of Cu of (1) is represented by the formula MX, wherein M is Cu, and X is one or more halogens selected from Cl, Br and I; or
said halide of Cu of (1) is represented by the formula $MX_2$, wherein M is Cu, and X is one or more halogens selected from Cl, Br and I; or
said halide of In, Ga of (1) is represented by the formula $M'X_3$, wherein M' is In and/or Ga, and X is one or more halogens selected from Cl, Br and I; or
said halide of Cu, In, Ga of (1) is represented by the formula $MM'X_4$, wherein M is Cu, M' is In and/or Ga, and X is one or more halogens selected from Cl, Br and I.

3. The method of claim 1, wherein
a) said amine salts of S and Se of (1) are the salts formed by $H_2S$ and $H_2Se$ with $N-R_1R_2R_3$, wherein $R_1$, $R_2$ and $R_3$ is independently selected from aryl, hydrogen, methyl, ethyl or $C_3$-$C_6$ alkyl; or b) said hydrazine salts of S and Se of step (1) are the salts formed by $H_2S$ and $H_2Se$ with $R_4R_5N-NR_6R_7$, wherein $R_4$, $R_5$, $R_6$ and $R_7$ is independently selected from aryl, hydrogen, methyl, ethyl or $C_3$-$C_6$ alkyl.

4. The method of claim 1, wherein
said chalcogenide of alkali metal is $A_2Q$, wherein A is selected from the group consisting of Li, Na, K, Rb, Cs and a combination thereof, and Q is selected from the group consisting of S, Se, Te and a combination thereof; and
said chalcogenide of alkali earth metal is BQ, wherein B is selected from the group consisting of Mg, Ca, Sr, Ba and a combination thereof, and Q is selected from the group consisting of S, Se, Te and a combination thereof.

5. The method of claim 1, wherein said excess degree of S or Se is 100%-400%.

6. The method of claim 1, wherein,
a mole ratio of a total amount of S and Se to a total amount of Cu, In and Ga ranges from 1.75 to 5 in said mixed clear solution of Cu, In, Ga, S and Se of step (2), and
a mole ratio of a total amount of S to a total amount of S and Se ranges from 0 to 0.4 in said mixed clear solution of Cu, In, Ga, S and Se of step (2).

7. The method of claim 1, wherein said light absorption layer of CIGSS thin film solar cell of (2) has a formula $Cu_{1-x}In_{1-y}Ga_ySe_{2-z}S_z$, wherein $0 \leq x \leq 0.3$, $0.2 \leq y \leq 0.4$, $0 \leq z \leq 0.2$.

8. The method of claim 1, wherein
said non-vacuum liquid phase process, which is used in step (3) for preparing said precursor thin film, is selected from the group consisting of spin-coating, tape-casting, spray-deposition, dip-coating, screen-printing, ink-jet printing, drop-casting, roller-coating, slot die coating, Meiyerbar coating, capillary coating, Comma-coating or gravure-coating; or
said substrate of (3) is selected from any of the group consisting of polyimide, Si wafer, amorphous hydrogenated silicon wafer, silicon carbide, silica, quartz, sapphire, glass, metal, diamond-like carbon, hydrogenated diamond-like carbon, gallium nitride, gallium arsenide, germanium, Si—Ge alloys, ITO, boron carbide, silicon nitride, alumina, ceria, tin oxide, zinc titanate and plastic.

9. The method of claim 8, wherein said precursor thin film is annealed at a temperature of 250-650° C.

10. The method of claim 1, wherein said precursor thin film is annealed at a temperature of 50-850° C.

11. The method of claim 10, wherein said precursor thin film is annealed in Se atmosphere at a temperature of 450-600° C. for 10 to 60 minutes, and in S atmosphere at a temperature of 350-550° C. for 10 to 60 minutes.

12. The method of claim 1, wherein a thickness of said CIGSS compound thin film of step (4) is 5-5000 nm.

13. The method of claim 1, wherein said adding said solution conditioner thereby stabilizes said clear stable source solutions.

* * * * *